United States Patent [19]

Matsubara et al.

[11] Patent Number: 5,166,542
[45] Date of Patent: Nov. 24, 1992

[54] SIGNAL CONVERTER FOR CONVERTING ANALOG SIGNAL INTO PULSE SIGNAL AND CONTROL SYSTEM USING THE SAME

[75] Inventors: Kunihiro Matsubara, Seto; Tetsuo Ide, Kasugai, both of Japan

[73] Assignees: Fujitsu Limited, Kawasaki; Fujitsu VLSI Limited, Kasugai, both of Japan

[21] Appl. No.: 563,325

[22] Filed: Aug. 7, 1990

[30] Foreign Application Priority Data

Aug. 7, 1989 [JP] Japan .................................. 1-204077

[51] Int. Cl.$^5$ .............................................. H03M 3/02
[52] U.S. Cl. ................................... 307/261; 307/268; 307/265; 307/519; 307/234
[58] Field of Search ............... 307/261, 268, 265, 519, 307/234

[56] References Cited

U.S. PATENT DOCUMENTS

| | | | |
|---|---|---|---|
| 4,339,727 | 7/1982 | Kage et al. | 307/261 |
| 4,441,041 | 4/1984 | Schröder et al. | 307/261 |
| 4,446,439 | 5/1984 | Mizumoto et al. | 307/519 |
| 4,734,842 | 3/1988 | Hantke | 307/265 |
| 4,902,970 | 2/1990 | Suquet | 307/261 |
| 4,940,977 | 7/1990 | Mandell | 341/144 |

FOREIGN PATENT DOCUMENTS

| | | |
|---|---|---|
| 3201811A1 | 1/1982 | Fed. Rep. of Germany . |
| 3430711A1 | 8/1984 | Fed. Rep. of Germany . |
| 2445248 | 12/1979 | France . |
| 53-53982 | 6/1978 | Japan . |

*Primary Examiner*—Janice A. Howell
*Assistant Examiner*—Scott A. Ouelette
*Attorney, Agent, or Firm*—Staas & Halsey

[57] ABSTRACT

A signal converter includes a frequency-to-voltage converter for converting a frequency of an input signal received via an input terminal into a control voltage. The input signal contains a noise signal having a frequency different from the frequency of the input signal. The control voltage changes in accordance with a change of the frequency of the input signal. A filter has a variable cutoff frequency so that the noise signal is eliminated from the input signal and outputs a filtered signal. The variable cutoff frequency is changed in accordance with a change of the control voltage so that a change of the variable cutoff frequency follows a change of the frequency of the input signal. A comparator compares the filtered signal with a reference voltage and converts the filtered signal into a pulse signal having a pulse width corresponding to the frequency of the input signal.

13 Claims, 8 Drawing Sheets

SIGNAL CONVERTER FOR CONVERTING ANALOG SIGNAL INTO PULSE SIGNAL AND CONTROL SYSTEM USING THE SAME

BACKGROUND OF THE INVENTION

The present invention generally relates to a signal converter for converting an analog signal into a pulse signal. Further, the present invention is concerned with a control system using the present signal converter.

A signal converter for converting an analog signal into a pulse signal is used in, for example, a detection circuit which detects a number of revolutions of a rotating member. A sensor provided in the detection circuit generates a sine wave detection signal having a frequency corresponding to a revolution of a rotating member. A signal converter converts the sine wave detection signal into a pulse signal having the same frequency as the sine wave detection signal. A revolution detector receives the pulse signal and measures the number of revolutions of the rotating member on the basis of the pulse width of the pulse signal.

Referring to FIG. 1A, there is illustrated a conventional signal converter which converts a sine wave detection signal indicative of the number of revolutions of a rotating member into a pulse signal having the same frequency as the sine wave detection signal. The signal converter shown in FIG. 1A is formed of a comparator 1. A sine wave detection signal S1 generated and output by a sensor (not shown) is applied to the comparator 1 via an input terminal Tin. The comparator 1 compares the sine wave detection signal with a reference voltage Vs, and generates a pulse signal S2 shown in FIG. 2. A revolution detector (not shown) is connected to the comparator 1 and detects a revolution of the rotating member on the basis of the pulse with of the pulse signal S2.

If the rotating member has an eccentricity, a low-frequency voltage component arising therefrom is superimposed on the pulse signal so that, as shown in FIG. 3, the sine wave detection signal S1 is changed to a pulse signal S3. When the pulse signal S3 having the low-frequency voltage component is input to the comparator 1, the comparator 1 outputs a pulse signal S4 having a pulse width which does not correspond to a variation in the frequency of the sine wave detection signal S2. Such a pulse width causes an error regarding the detected number of revolutions of the rotating member which is not negligible.

Conventionally, as shown in FIG. 1B, a filter circuit 4 having a fixed cutoff frequency is interposed between the input terminal Tin and the comparator 1. However, if the frequency of a signal to be detected changes in a wide frequency range, the filter circuit 4 does not operate effectively.

As shown in FIG. 4A, even if the cutout frequency, labeled CF, of the filter circuit 4 is set between a signal S to be detected and an unnecessary (noise) signal N having a low frequency due to the presence of an eccentricity for example, there is a possibility that the frequencies of the signal S and the noise signal N will change greatly and thus become higher than the cutoff frequency CF, as shown in FIG. 4B. In this case, the filter circuit 4 does not operate effectively. On the other hand, if the frequencies of the signal S and the noise signal N change greatly and thus become lower than the cutoff frequency CF, the signal S is attenuated together with the noise signal N.

SUMMARY OF THE INVENTION

It is a general object of the present invention to provide an improved signal converter in which the aforementioned problems are eliminated.

A more specific object of the present invention is to provide a signal converter capable of generating a pulse signal having a pulse width which is less affected by the presence of a low-frequency noise signal.

The above-mentioned objects of the present invention are achieved by a signal converter comprising: converter means for converting a frequency of an input signal received via an input terminal into a control voltage, the input signal containing a noise signal having a frequency different from the frequency of the input signal, the control voltage changing in accordance with a change of the frequency of the input signal; filter means, coupled to the converter means and having a variable cutoff frequency, for filtering the input signal so that the noise signal is eliminated from the input signal and for outputting a filtered signal, the variable cutoff frequency being changed in accordance with a change of the control voltage so that a change of the variable cutoff frequency follows a change of the frequency of the input signal; and comparator means, coupled to the filter means, for comparing the filtered signal with a reference voltage and for converting the filtered signal into a pulse signal having a pulse width corresponding to the frequency of the input signal.

Another object of the present invention is to provide a control system which uses the above-mentioned signal converter.

This object of the present invention is achieved by a control system comprising: sensor means for measuring a physical change and for generating a sensor output; signal converter means, coupled to the sensor means, for receiving the sensor output as an input signal and for generating a pulse signal from the input signal; and control means, coupled to the signal converter means, for driving an object to be controlled in accordance with the pulse signal. The signal converter means comprises: converter means for converting a frequency of the input signal received via an input terminal into a control voltage, the input signal containing a noise signal having a frequency different from the frequency of the input signal, the control voltage changing in accordance with a change of the frequency of the input signal; filter means, coupled to the converter means and having a variable cutoff frequency, for filtering the input signal so that the noise signal is eliminated from the input signal and for outputting a filtered signal, the variable cutoff frequency being changed in accordance with a change of the control voltage so that a change of the variable cutoff frequency follows a change of the frequency of the input signal; and comparator means, coupled to the filter means, for comparing the filtered signal with a reference voltage and for converting the filtered signal into the pulse signal having a pulse width corresponding to the frequency of the input signal.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

Figure 5A:
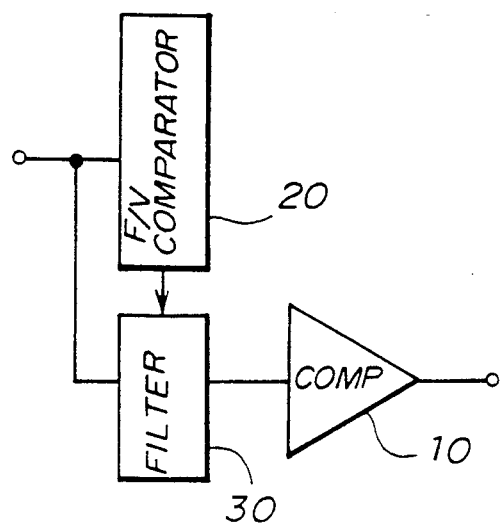
FIG. 5A is a block diagram illustrating the principle of a signal converter according to the present invention.
Figure 6A:
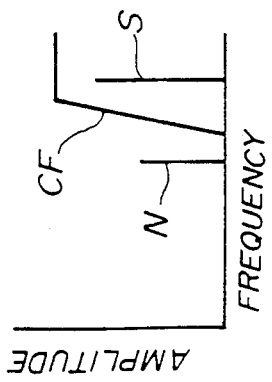
FIGS. 6A and 6B are diagrams illustrating the operation of a filter shown in FIG. 5B.
Figure 6B:
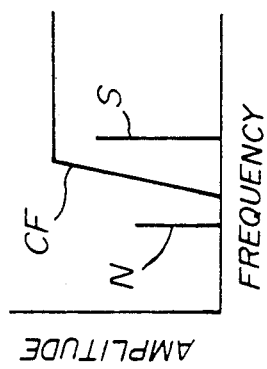

Referring to FIG. 5A, there is illustrated the principle of the present invention. A signal converter shown in FIG. 5A is composed of a comparator 10, a frequency-to-voltage converter (hereinafter simply referred to as an F/V converter) 20 and a filter circuit 30. An input signal having a continuously changing voltage is input to the F/V converter 20 and the filter circuit 30. The F/V converter 20 generates a control voltage which changes in accordance with a change of the frequency of the input signal. The control voltage is applied to the filter circuit 30, which has a variable cutoff frequency which varies in accordance with the control voltage so that the cutoff frequency changes so as to follow a change of the frequency of the input signal. Thus, noise signal components can be eliminated from the input signal by the filter circuit 30 and thus, the comparator 10 is supplied with a signal which does not contain noise signal components. As shown in FIG. 6A and FIG. 6B, even if the frequencies of the signal S to be detected and the noise signal N vary, the cutoff frequency CF of the filter circuit 30 is changed so as to follow frequency changes in the signal S and the noise signal N. As a result, the noise component N can be eliminated from the input signal effectively.

Figure 5B:
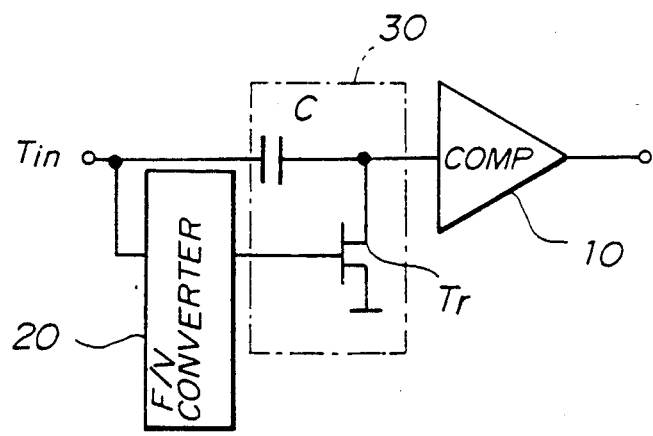
FIG. 5B is a diagram illustrating a signal converter according to a preferred embodiment of the present invention.

FIG. 5B illustrates a circuit of the filter circuit 30 shown in FIG. 5A. The filter circuit 30 is composed of a capacitor C and a MIS (metal insulator semiconductor) transistor Tr. One of the two ends of the capacitor C is connected to the input terminal Tin and the other end thereof is connected to the comparator 10 and grounded through the MIS transistor Tr. The gate of the MIS transistor Tr is connected to an output terminal of the F/V converter 20. The F/V converter 20 generates the control voltage (D.C. voltage) corresponding to the frequency of the input signal applied to the input terminal Tin. The control voltage changes in proportion to the frequency of the input signal. The control voltage output by the F/V converter 20 turns ON the MIS transistor Tr, and changes the impedance (ON resistance) thereof. A low-frequency band cutoff filter is composed of the capacitor C and the MIS transistor Tr. The cutoff frequency CF of the cutoff filter is altered, depending on a frequency change of the input signal. As a result, there is a substantially constant bandwidth between the frequency of the input signal and the cutoff frequency CF.

Figure 2:
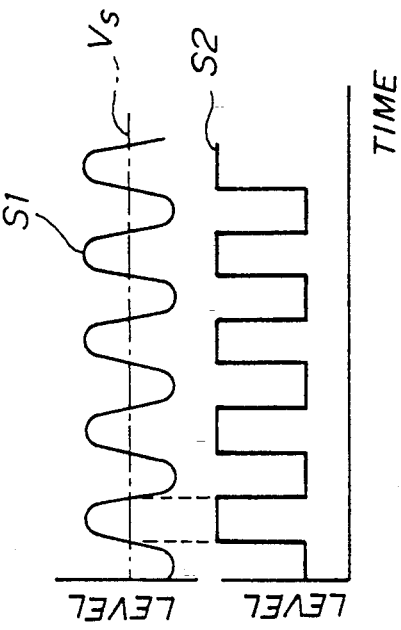
FIG. 2 is a waveform diagram illustrating input and output signals of the signal converter shown in FIG. 1A or FIG. 1B.
Figure 1A:
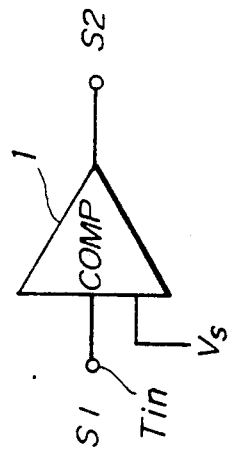
FIG. 1A is a block diagram of a conventional signal converter.
Figure 1B:
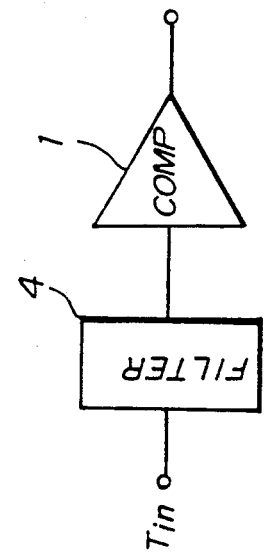
FIG. 1B is a block diagram of another conventional signal converter.
Figure 3:
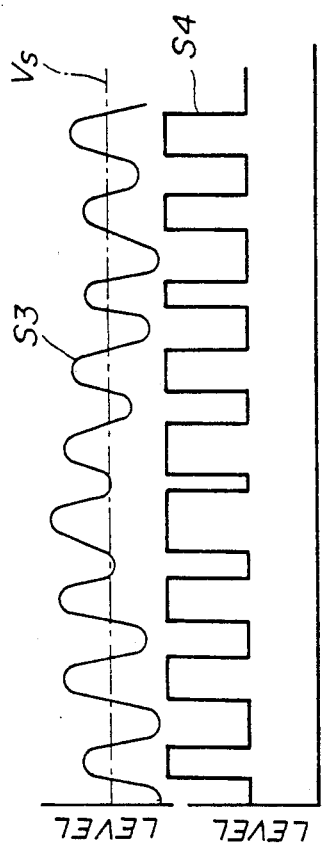
FIG. 3 is a waveform diagram illustrating the input and output signals of the signal converter shown in FIG. 1A or FIG. 1B, in which the input signal has a low-frequency noise signal.
Figure 4A:
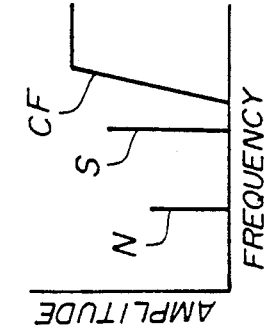
FIGS. 4A through 4C are frequency spectra graphics illustrating the operation of a filter circuit shown in FIG. 1B.
Figure 4B:
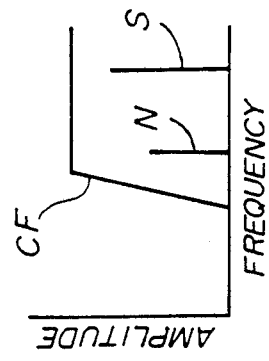
Figure 4C:
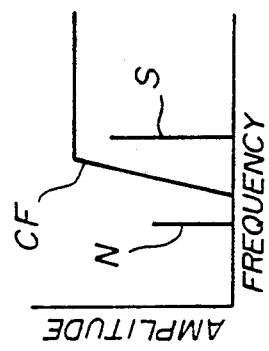

When the sine wave input signal S3 shown in FIG. 3 is applied to the input terminal Tin (FIG. 5B), the MIS transistor Tr conducts and provides the impedance corresponding to the control voltage generated and output by the F/V converter 20. Low-frequency components are eliminated from the sine wave input signal S3 due to the low-frequency band cutoff function provided by the combination of the capacitor C and the MIS transistor Tr. Thus, the comparator 10 is supplied with the sine wave signal S1 as shown in FIG. 2. As a result, the comparator 10 outputs a pulse signal, such as the pulse signal S1 shown in FIG. 2. The pulse signal S1 thus generated is applied to, for example, a revolution detector.

When the frequency of the sine wave input signal applied to the input terminal Tin becomes higher, an increased control voltage is generated by the F/V converter 20. Thus, the impedance of the MIS transistor Tr is decreased so that the cutoff frequency of the filter circuit 30 becomes higher. On the other hand, when the frequency of the sine wave signal becomes lower, the cutoff frequency of the filter circuit 30 becomes lower. In this way, the cutoff frequency of the filter circuit 30 is changed so that it follows a variation in the frequency of the input signal. As a result, the cutoff frequency of the filter circuit 30 is always regulated at an appropriate frequency so that it separates the input signal from the noise signal. In addition, the noise signal is integrated so that a change of the frequency of the noise signal is suppressed.

Figure 7:
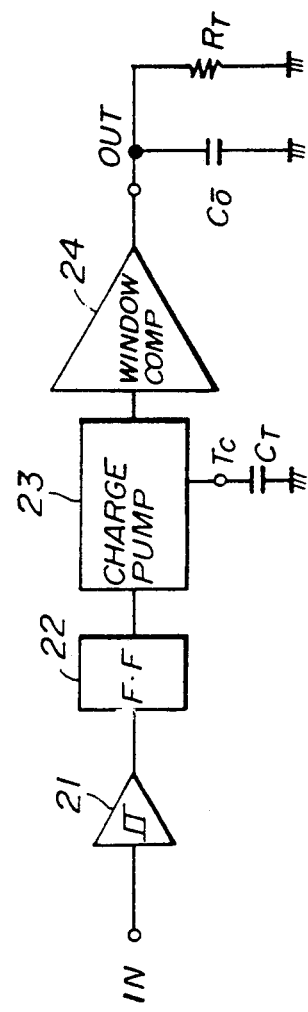
FIG. 7 is a block diagram of a frequency-to-voltage converter shown in FIG. 5A or FIG. 5B.
Figure 8:
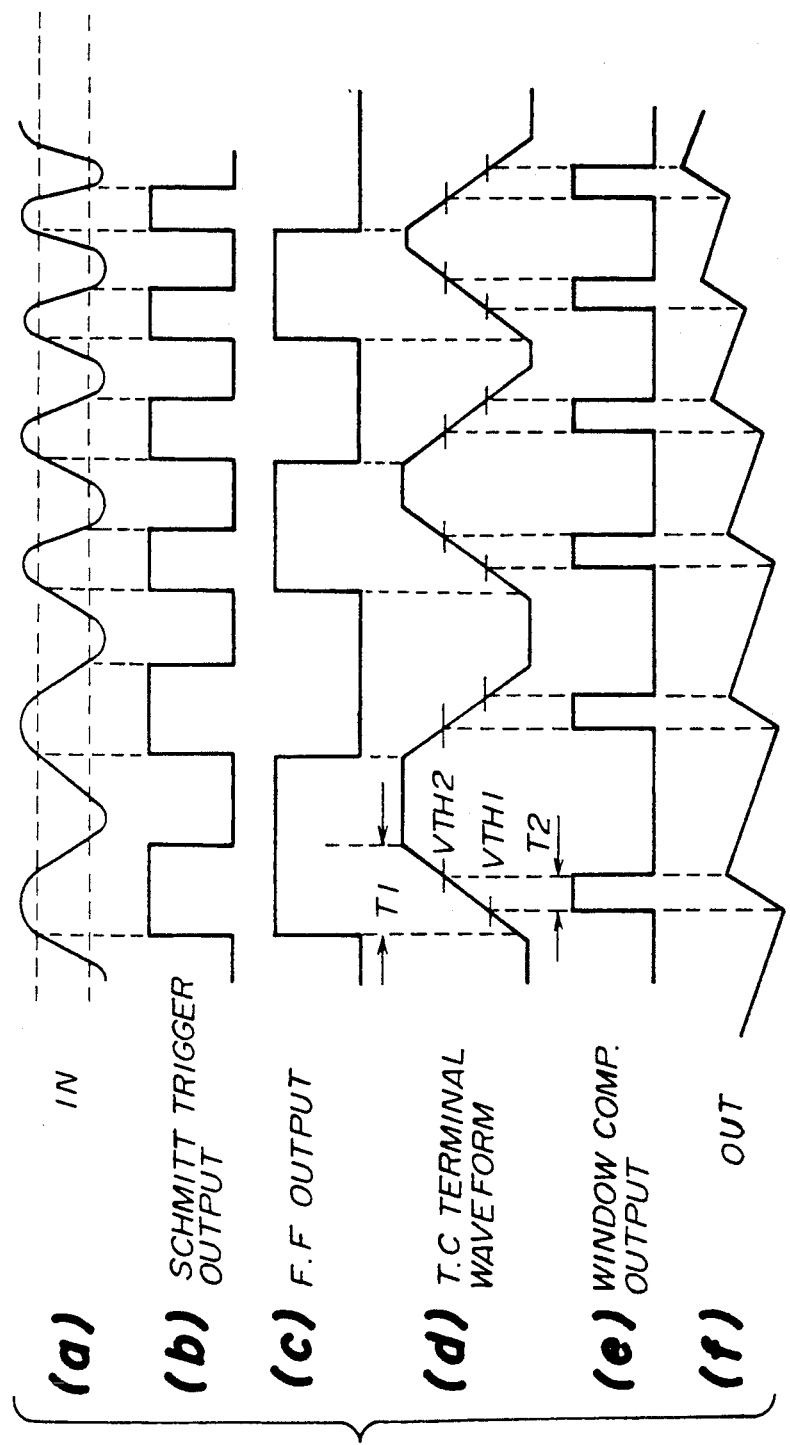
FIG. 8 is a waveform diagram illustrating the operation of the frequency-to-voltage converter shown in FIG. 5A or 5B.

Referring to FIG. 7, there is illustrated a more detailed configuration of the F/V converter 20 shown in FIGS. 5A and 5B. The F/V converter 20 comprises a Schmitt trigger circuit 21, a flip-flop 22, a charge pump circuit 23 and a window comparator 24. The Schmitt trigger circuit 21 changes the sine wave input signal as shown in FIG. 8-(a) into a rectangular wave signal as shown in FIG. 8-(b). The flip-flop (FF) 22 latches each rising edge of the Schmitt trigger output shown in FIG. 8-(b). That is, the flip-flop 22 divides the frequency of the Schmitt trigger output. The charge pump circuit 23 charges and discharges a capacitor $C_T$ externally connected between the charge pump circuit 23 and ground under the control of the output signal of the flip-flop 22. More specifically, the capacitor $C_T$ is charged by each rising edge of the flip-flop output and discharged by each falling edge thereof. Since the capacitor $C_T$ is charged and discharged by a constant current, it is possible to charge and discharge the capacitor $C_T$ at a constant speed T1 shown in FIG. 8-(c). FIG. 8-(d) shows a waveform observed at a node Tc shown in FIG. 7. The window comparator 24 converts the output signal (FIG. 8-(d)) from the charge pump circuit 23 into a pulse signal shown in FIG. 8-(e) by using two threshold levels VTH1 and VTH2. The output signal of the window comparator 24 is smoothed by a filter circuit composed of a capacitor Co and a resistor $R_T$, as shown in FIG. 8-(f). The cutoff frequency of the filter circuit 30 changes in accordance with a change of the frequency of the input signal. In addition, the F/V converter 20 has the signal integration function.

Figure 9:
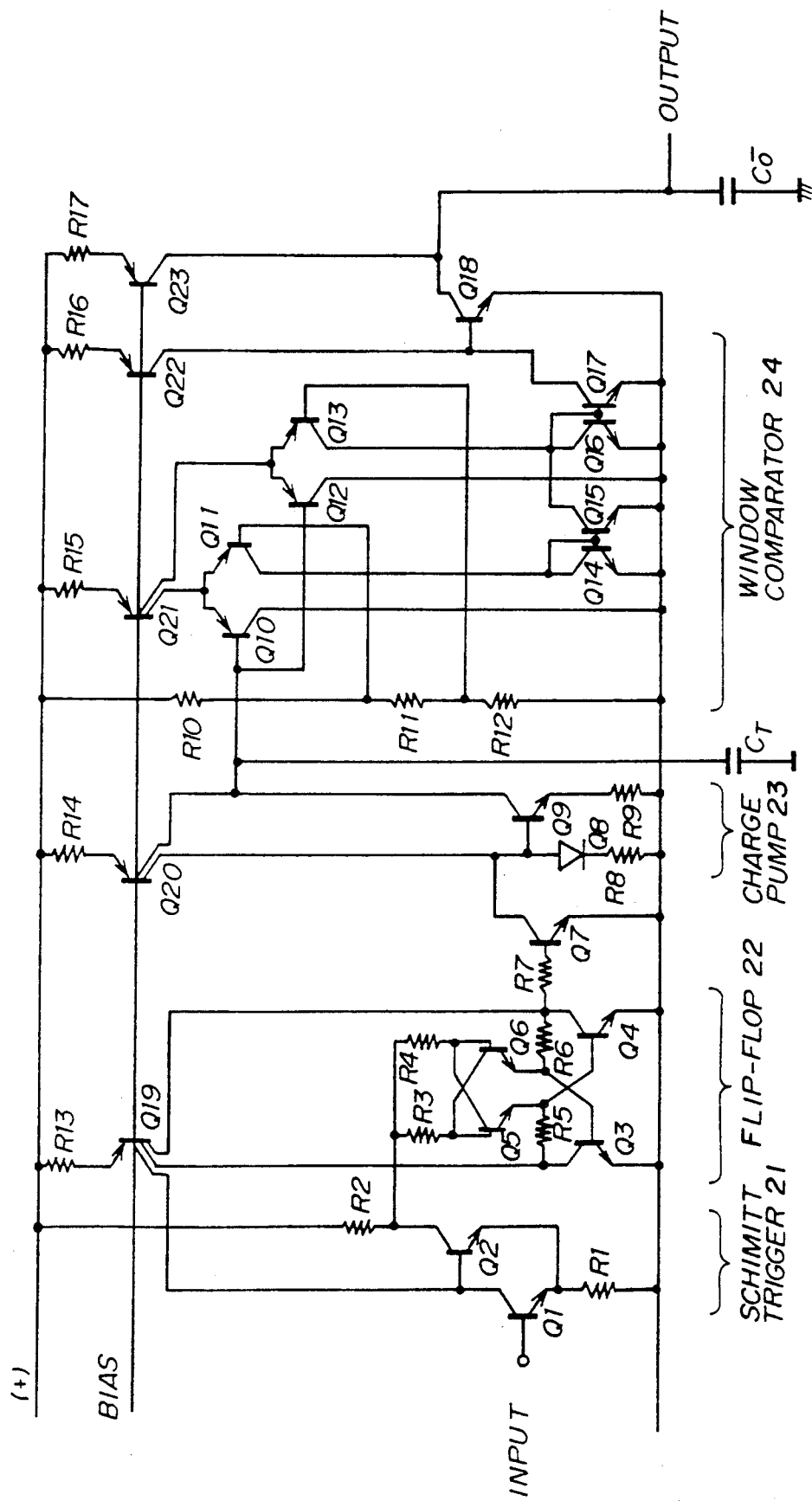
FIG. 9 is a circuit diagram of the frequency-to-voltage voltage converter shown in FIG. 7.

FIG. 9 is a circuit diagram of the F/V converter 20. The Schmitt trigger circuit 21 is composed of bipolar transistors Q1 and Q2, and resistors R1 and R2. The sine wave input signal via the input terminal Tin (FIG. 6) is applied to the base of the transistor Q1. The flip-flop 22 is composed of transistors Q3, Q4, Q5 and Q6, and resistors R3, R4, R5 and R6. The collector of the transistor Q2 is connected to the resistors R3 and R4. The charge pump circuit 23 is composed of a diode Q8, a transistor Q9 and two resistors R8 and R9. The collector of the transistor Q4 of the flip-flop 22 is coupled to the base of the transistor Q9 via a resistor R7 and a transistor Q7. The base of the transistor Q9 is connected to a negative power supply line through the diode Q8 and the resistor R8. The collector of the transistor Q9 is grounded via the aforementioned capacitor $C_T$. The window comparator 24 is composed of transistors Q10–Q18, and resistors R10–R12. The collector of the transistor Q9 is connected to the bases of the transistors Q10 and Q12. The bases of the transistors Q11 and Q13 are supplied with respective reference voltages, which are generated by a resistor network consisting of the resistors R10–R12 connected between the positive and negative power supply lines. The collector of the transistor Q11 is connected to the collector and base of the transistor Q14 as well as the base of the transistor Q15. The collector of the transistor Q15 is connected to the collectors of the transistors Q13 and Q16 and the bases of the transistors Q16 and Q17. The emitters of the transistors Q14–Q17 are connected to the negative power supply line. The collector of the transistor Q17 is connected to the base of the transistor Q18, and the collector of the latter is connected to the capacitor Co.

The F/V converter 20 further includes transistors Q19–Q23 and associated resistors R13–R17, respectively. The bases of the transistors Q19–Q23 are biased. The emitters of the transistors Q19–Q23 are coupled to the positive power supply line via the resistors R13–R17, respectively. The transistor Q19 has three emitters. The first emitter of the transistor Q19 is connected to the collector of the transistor Q1 and the base of the transistor Q2. The second emitter of the transistor Q19 is connected to the collector of the transistor Q3. The third emitter of the transistor Q19 is connected to the collector of the transistor Q4. The transistor Q20 has two collectors. The first collector of the transistor Q20 is connected to the anode of the diode Q8, and the second collector thereof is connected to the collector of the transistor Q9 and the base of the transistor Q10. The transistor Q21 has two collectors. The first collector of the transistor Q21 is connected to the emitters of the transistors Q10 and Q11, and the second collector thereof is connected to the emitters of the transistors Q12 and Q13. The collector of the transistor Q22 is connected to the collector of the transistor Q17 and the base of the transistor Q18. The collector of the transistor Q23 is connected to the collector of the transistor Q18.

Figure 10:
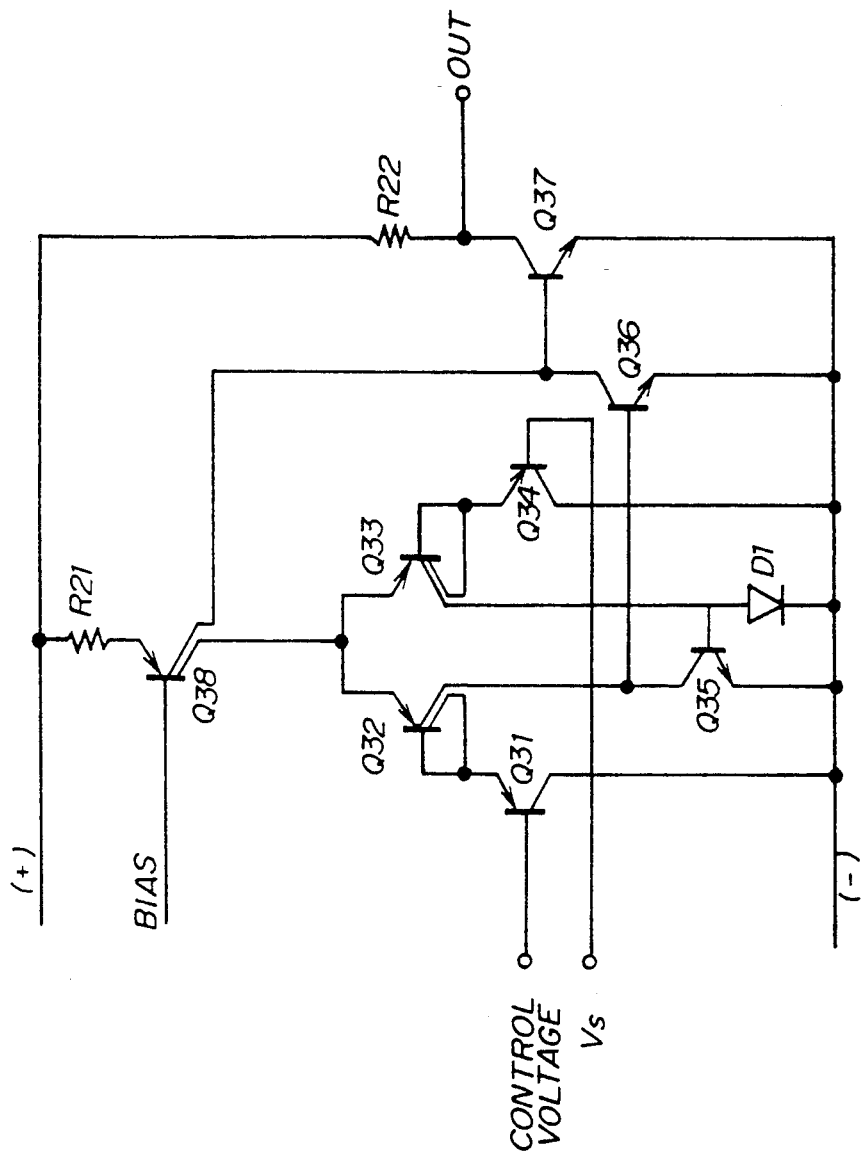
FIG. 10 is a circuit diagram of a comparator shown in FIG. 5A or 5B.

FIG. 10 is a circuit diagram of the comparator 10 shown in FIGS. 5A and 5B. The comparator 10 is composed of transistors Q31–Q38, a diode D1 and two resistors R21 and R22. The bases of the transistors Q31 and Q34 are supplied with the control voltage generated and output by the F/V converter 20 and the reference voltage Vs, respectively. The pulse signal is drawn from the collector of the transistor Q37.

Figure 11:
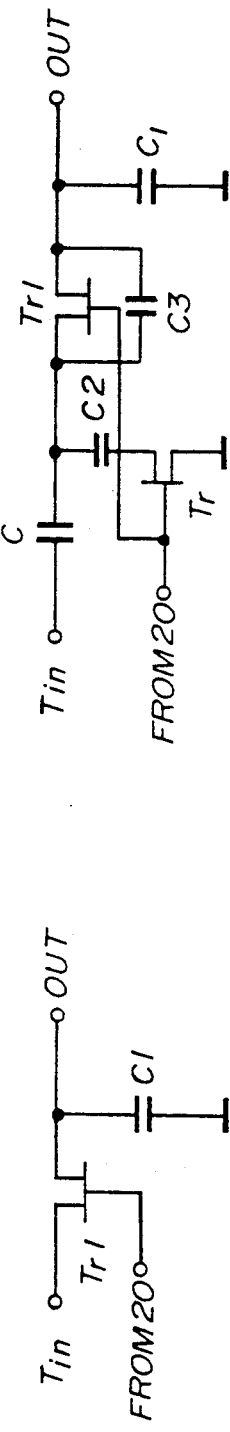
FIG. 11 is a circuit diagram of a filter circuit which can be substituted for the configuration shown in FIG. 5A or 5B.

FIG. 11 is a circuit diagram of a high-frequency cutoff filter, which can be substituted for the low-frequency cutoff filter shown in FIGS. 5A and 5B. If noise components have frequencies higher than the signal S, the filter shown in FIG. 11 is used. The high-frequency cutoff filter shown in FIG. 11 is made up of a MIS transistor Tr1 and a capacitor. The MIS transistor Tr1 is interposed between the input terminal Tin and the comparator 10. The gate of the MIS transistor Tr1 is supplied with the control voltage generated and output by the F/V converter 20. The cutoff frequency of the high-frequency cutoff filter shown in FIG. 11 separates the input signal from noise components. The cutoff frequency of the high-frequency cutoff filter is set to be higher than the frequency of the signal S.

Figure 12:
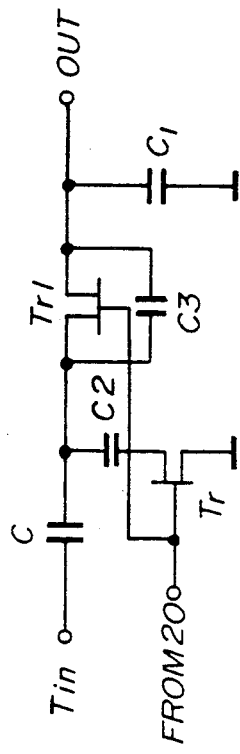
FIG. 12 is a circuit diagram of another filter circuit which can be substituted for the configuration shown in FIG. 5A or 5B.

FIG. 12 is a circuit diagram of a bandpass filter, which can be substituted for the low-frequency cutoff filter shown in FIGS. 5A and 5B or the high-frequency cutoff filter shown in FIG. 11. The bandpass filter shown in FIG. 12 is based on the combination of the low-frequency cutoff filter (FIGS. 5A and 5B) and the high-frequency cutoff filter (FIG. 11). The input terminal Tin is coupled to the drain of the MIS transistor Tr (N-channel MIS transistor) through capacitors C and C2. The control voltage generated and output by the F/V converter 20 is applied to the gate of the MIS transistor Tr and the gate of the MIS transistor Tr1. The drain and source of the MIS transistor Tr1 is bypassed through a capacitor C3. The output terminal of the bandpass filter is grounded through the capacitor Cl. The bandpass filter has a first cutoff frequency between the frequency of the input signal and the frequency of the noise signal and a second cutoff frequency higher than the frequency of the input signal. Alternately, it is possible to use a band cutoff filter which passes only the frequency of the input signal.

Figure 13:
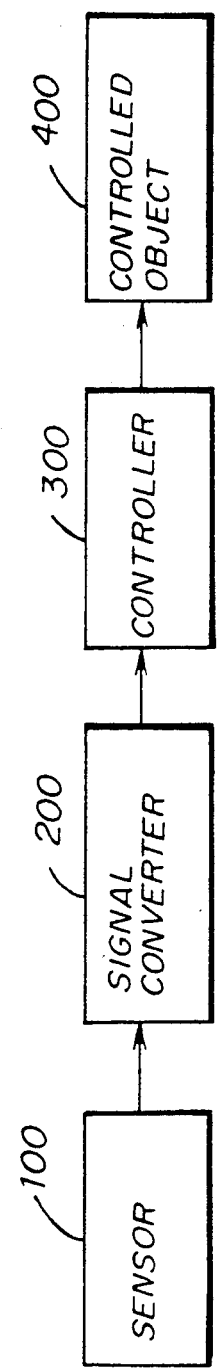
FIG. 13 is a block diagram of a control system to which the signal converter according to the present invention is applied.

FIG. 13 is a block diagram of a control system to which the above-mentioned signal converter is applied. A sensor 100 generates an analog detection signal indicative of a physical value. A signal converter 200 having the aforementioned configuration converts the analog detection signal into a pulse signal. A controller 300 receives the pulse signal and controls an object (or "controlled object") 400 to be controlled in accordance with the pulse width of the pulse signal. For example, the system shown in FIG. 13 can be applied to an antilock braking system installed in a vehicle.

The present invention is not limited to the specifically described embodiments, and variations and modifications may be made without departing from the scope of the present invention.

What is claimed is:
1. A signal converter comprising:
  converter means for converting a frequency of an input signal received via an input terminal into a control voltage, said input signal containing a noise signal having a frequency different from the fre- quency of said input signal, said control voltage having a voltage level which changes in accordance with a change of the frequency of said input signal;

filter means, coupled to said converter means to receive said control voltage and having a variable cutoff frequency, for filtering said input signal so that said noise signal is eliminated from said input signal and for outputting a filtered signal, said variable cutoff frequency being changed in accordance with a change of said control voltage so that a change of said variable cutoff frequency follows a change of the frequency of said input signal; and comparator means, coupled to said filter means, for comparing said filtered signal with a reference voltage and for converting said filtered signal into a pulse signal having a pulse width corresponding to the frequency of said input signal, the input signal being directly applied to said converter means.

2. A signal converter as claimed in claim 1, wherein:
said noise signal has a frequency lower than the frequency of said input signal, and
said filter means comprises a low-frequency cutoff filter having said cutoff frequency between the frequency of said input signal and the frequency of said noise signal.

3. A signal converter as claimed in claim 1, wherein:
said noise signal has a frequency higher than the frequency of said input signal; and
said filter means comprises a high-frequency cutoff filter having said cutoff frequency between the frequency of said input signal and the frequency of said noise signal.

4. A signal converter as claimed in claim 1, wherein:
said filter means comprises a bandpass filter;
said cutoff frequency comprises a first cutoff frequency lower than the frequency of said input signal and a second cutoff frequency higher than the frequency of said input signal; and
said bandpass filter passes signal components including said input signal between said first cutoff frequency and said second cutoff frequency.

5. A signal converter as claimed in claim 2, wherein said low-frequency cutoff filter comprises:
a capacitor connected between said input terminal and said comparator means; and
a MIS transistor which is connected between a reference potential node and a connection node of said capacitor and said comparator means and which has a gate for receiving said control voltage.

6. A signal converter as claimed in claim 3, wherein said high-frequency cutoff filter comprises:
a MIS transistor which is connected between said input terminal and said comparator means and which has a gate for receiving said control voltage; and
a capacitor connected between a reference potential node and a connection node of said transistor and said comparator means.

7. A signal converter as claimed in claim 4, wherein said bandpass filter comprises:
a series circuit composed of first and second capacitors and having a first end connected to said input terminal, a second end, and a connection node between said first and second capacitors;
a first MIS transistor which is connected between said second end and a reference potential node and which has a gate for receiving said control voltage;
a second MIS transistor which is connected to said connection node and said comparator means and which has a gate for receiving said control voltage;
a third capacitor connected across said second MIS transistor; and
a fourth capacitor connected between said third capacitor and said reference potential node.

8. A signal converter as claimed in claim 1, wherein said converter means comprises:
Schmitt trigger means for converting said input signal into a first rectangular wave signal;
frequency dividing means, coupled to said Schmitt trigger means, for generating a second rectangular wave signal having a frequency lower than that of said first rectangular wave signal;
charge pump means, coupled to said Schmitt trigger means and having a capacitor, for charging and discharging said capacitor in accordance with said second rectangular wave signal; and
window comparator means, coupled to said charge pump means, for converting a potential change at said capacitor of said charge pump means into a pulse shaped window comparator output.

9. A signal converter as claimed in claim 8, wherein said converter means further comprises smoothing means, coupled to said window comparator means, for smoothing said pulse shaped window comparator so that said control voltage is generated.

10. A signal converter as claimed in claim 1, wherein said converter means comprises signal integrating means for integrating said noise signal contained in said input signal so that said noise signal is reduced.

11. A signal converter as claimed in claim 1, wherein said input signal is an analog signal.

12. A signal converter as claimed in claim 1, wherein said filter means comprises a band cutoff filter which passes only said input signal.

13. A control system comprising:
sensor means for generating a sensor output;
signal converter means, coupled to said sensor means, for receiving said sensor output as an input signal and for generating a pulse signal from said input signal; and
control means, coupled to said signal converter means, for driving an object to be controlled in accordance with said pulse signal,
wherein said signal converter means includes
converter means for converting a frequency of said input signal received via an input terminal into a control voltage, said input signal containing a noise signal having a frequency different from the frequency of said input signal, said control voltage changing in accordance with a change of the frequency of said input signal,
filter means, coupled to said converter means and having a variable cutoff frequency, for filtering said input signal so that said noise signal is eliminated from said input signal and for outputting a filtered signal, said variable cutoff frequency being changed in accordance with a change of said control voltage so that a change of said variable cutoff frequency follows a change of the frequency of said input signal, and
comparator means, coupled to said filter means, for comparing said filtered signal with a reference voltage and for converting said filtered signal into said pulse signal having a pulse width corresponding to the frequency of said input signal.

* * * * *